(12) United States Patent
Werner et al.

(10) Patent No.: US 7,162,672 B2
(45) Date of Patent: Jan. 9, 2007

(54) MULTILEVEL SIGNAL INTERFACE TESTING WITH BINARY TEST APPARATUS BY EMULATION OF MULTILEVEL SIGNALS

(75) Inventors: Carl W. Werner, Los Gatos, CA (US); Jared L. Zerbe, Woodside, CA (US); William F. Stonecypher, San Jose, CA (US); Haw-Jyh Liaw, Fremont, CA (US); Timothy C. Chang, Saratoga, CA (US)

(73) Assignee: Rambus Inc, Los Altos, CA (US)

( * ) Notice: Subject to any disclaimer, the term of this patent is extended or adjusted under 35 U.S.C. 154(b) by 671 days.

(21) Appl. No.: 09/953,486

(22) Filed: Sep. 14, 2001

(65) Prior Publication Data

US 2003/0093713 A1    May 15, 2003

(51) Int. Cl.
*G01R 31/28* (2006.01)
*G01R 31/02* (2006.01)

(52) U.S. Cl. ............... 714/724; 324/765; 324/763; 326/16

(58) Field of Classification Search ........... 714/810, 714/724, 424; 324/765, 763; 326/16
See application file for complete search history.

(56) References Cited

U.S. PATENT DOCUMENTS

| | | | |
|---|---|---|---|
| 3,872,381 A * | 3/1975 | Yamamoto et al. ......... 375/290 |
| 5,097,144 A | 3/1992 | Chang et al. |
| 5,295,157 A | 3/1994 | Suzuki et al. ................. 375/11 |
| 5,533,054 A * | 7/1996 | DeAndrea et al. .......... 375/286 |
| 5,946,355 A | 8/1999 | Baker ........................ 375/286 |
| 5,968,191 A | 10/1999 | Thatcher et al. ............. 714/723 |
| 5,982,827 A | 11/1999 | Duffner et al. .............. 375/354 |
| 6,005,895 A | 12/1999 | Perino et al. ................ 375/288 |
| 6,055,661 A | 4/2000 | Luk |
| 6,061,395 A | 5/2000 | Tonami ....................... 375/232 |
| 6,061,818 A | 5/2000 | Touba et al. ................. 714/739 |
| 6,070,256 A | 5/2000 | Wu et al. .................... 714/718 |
| 6,075,725 A | 6/2000 | Choi et al. ................. 365/185.2 |
| 6,078,627 A | 6/2000 | Crayford .................... 375/286 |
| 6,175,939 B1 | 1/2001 | Dinteman |
| 6,222,380 B1 | 4/2001 | Gerowitz et al. ............. 326/38 |
| 6,275,962 B1 | 8/2001 | Fuller et al. |
| 6,452,411 B1 | 9/2002 | Miller et al. |
| 6,499,121 B1 * | 12/2002 | Roy et al. .................... 714/724 |
| 6,622,272 B1 * | 9/2003 | Haverkamp et al. ......... 714/725 |

OTHER PUBLICATIONS

U.S. Appl. No. 09/770,406, filed Aug. 2, 2001, Hedburg.
U.S. Appl. No. 09/201,114, filed Sep. 11, 2001, Hasegawa et al.
U.S. Appl. No. 09/795,811, filed Sep. 13, 2001, Govindarajan et al.

(Continued)

*Primary Examiner*—Guy Lamarre
*Assistant Examiner*—Esaw Abraham
(74) *Attorney, Agent, or Firm*—Mark Lauer; Silicon Edge Law Group LLP; Arthur J. Behiel

(57) ABSTRACT

Error detection mechanisms for devices that have multilevel signal interfaces test multilevel signals of an interface with a binary test apparatus. The error detection mechanisms include converting between multilevel signals of the interface and binary signals of the test apparatus. The error detection mechanisms also include repeated transmission of multilevel signals stored in a memory of a device having a multilevel signal interface for detection by the test apparatus at different binary levels.

26 Claims, 11 Drawing Sheets

OTHER PUBLICATIONS

S. D. Cova et al., "Characterization of Individual Weights in Transversal Filters and Application to CCD's" IEEE Journal of Solid-State Circuits, vol. SC-17, No. 6, Dec. 1982.

Dally et al., "Multi-Gigabit Signaling with CMOS", May 12, 1997.

A. Fiedler et al., "A 1.0625Gbps Transceiver with 2x-Oversampling and Transmit Signal Pre-Emphasis", 1997 IEEE International Solid State Circuit Conference and Slideset.

"4 Modulation Schemes for High Bit Rate Data Transmission in the Loop Plant", printed Aug. 10, 2000, pp. 1-29.

K. Azedet et al., "WA 18.3 A Gigabit Transceiver Chip Set for UTP CAT-6 Cables in Digital CMOS Technology", 2000 IEEE International Solid-Sate Circuits Conference, ISSCC 2000/Session 18/WIireline Communications/Paper WA 18.3, pp. 306-307.

G. Thompson, "How 1000BASE-T Works", IEEE802.3 Plenary, Nov. 13, 1997, Montreal PQ Canada, 8 pages.

I. A. Pérez-Alvarez et al., "A Differential Error Reference Adaptive Echo Canceller for Multilevel Pam Line Codes", Copyright 1996, IEEE, pp. 1707-1710.

"802.3ab, A Tutorial Presentation", 63 pages, undated, believed by applicants to have been presented at an IEEE 802.3 working group meeting in Mar. 1998.

"P802.3ad Draft Supplement to Carrier Sense Multiple Access with Collision Detection (CSMA/CD) Access Method & Physical Layer Specifications: Link Aggregation", Prepared by the LAN Man Standards Committee of the IEEE Computer Society, Jul. 1999.

IEEE Standard 802.3ab-1999, 802.3 Supplement, Local and Metropolitan Area Networks, Jul. 26, 1999.

* cited by examiner

MULTILEVEL SIGNAL INTERFACE TESTING WITH BINARY TEST APPARATUS BY EMULATION OF MULTILEVEL SIGNALS

BACKGROUND OF THE INVENTION

The present invention relates to multilevel digital signaling, and in particular to techniques to test for errors that may occur in a multilevel, multi-line signaling system.

The use of multiple signal levels instead of binary signal levels is a known technique for increasing the data rate of a digital signaling system, without necessarily increasing the signal frequency of the system. Such multilevel signaling is sometimes known as multiple pulse amplitude modulation or multi-PAM, and has been implemented with radio or other long-distance wireless signaling systems.

Other long-distance uses for multi-PAM signaling include computer or telecommunication systems that employ Gigabit Ethernet over optical fiber (IEEE 802.3z) and over copper wires (IEEE 802.3ab), which use three and five signal levels, respectively, spaced symmetrically about and including ground.

Multi-PAM has not traditionally been used for communication between devices in close proximity or belonging to the same system, such as those connected to the same integrated circuit (IC) or printed circuit board (PCB). One reason for this may be that within such a system the characteristics of transmission lines, such as buses or signal lines, over which signals travel are tightly controlled, so that increases in data rate may be achieved by simply increasing data frequency. At higher frequencies, however, receiving devices may have a reduced ability to distinguish binary signals, so that dividing signals into smaller levels for multi-PAM is problematic. Multi-PAM may also be more difficult to implement in multi-drop bus systems (i.e., buses shared by multiple processing mechanisms), since the lower signal-to-noise ratio for such systems sometimes results in bit errors even for binary signals.

Testing of a multi-PAM device is also problematic, since test apparatuses are typically designed for testing binary signals. Thus, in addition to the complexities of designing a multi-PAM device, there may not be conventional means for testing a multi-PAM device to ensure that the device operates free of errors.

SUMMARY

The present invention is directed to error detection mechanisms for multilevel signal interfaces. Such error detection mechanisms may involve translating between the multilevel signals of an interface and binary signals of a test apparatus. The error detection mechanisms may be particularly advantageous for testing integrated circuits designed to communicate according to multi-PAM signals over printed circuit boards.

DETAILED DESCRIPTION OF THE PREFERRED EMBODIMENT

Figure 1:
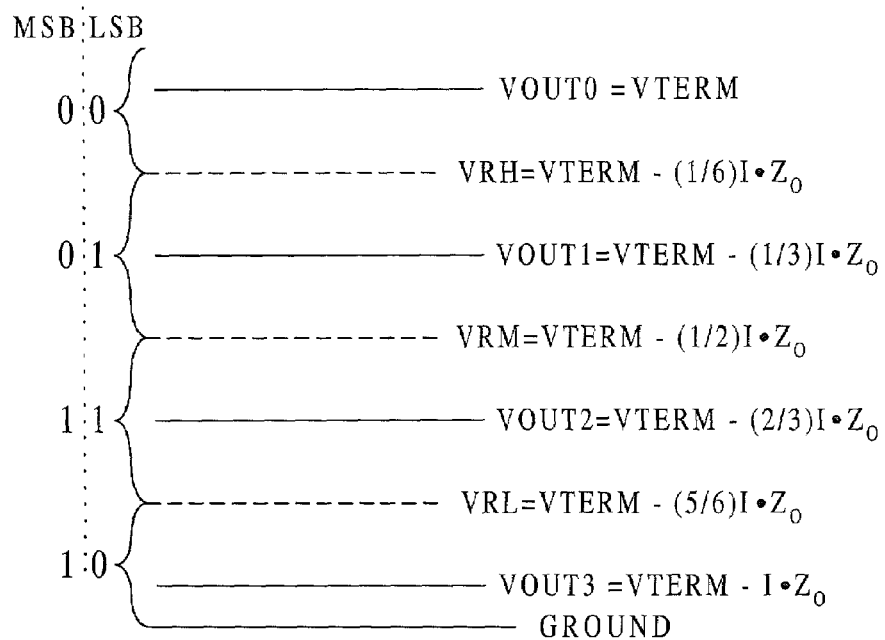
FIG. 1 is a diagram of a multilevel signaling system having four logical states corresponding to four voltage ranges.

FIG. 1 shows a multilevel signal system having four logical states corresponding to four distinct voltage levels, VOUT0, VOUT1, VOUT2 and VOUT3. The voltage levels in this example are all positive relative to ground, and range as high as VTERM. VOUT0 is defined to be above VREFH, VOUT1 is defined to be between VREFM and VREFH, VOUT2 is defined to be between VREFL and VREFM, and VOUT3 is defined to be less than VREFL. VOUT0 corresponds to logical state 00, VOUT1 corresponds to logical state 01, VOUT2 corresponds to logical state 11, and VOUT3 corresponds to logical state 10. An example of the 4-PAM system described above has been implemented for a memory system interface having VOUT0=1.80V, VOUT1=1.533V, VOUT2=1.266V and VOUT3=1.00V. Although four logical states are illustrated in this example, a multilevel signal system may have more or fewer logical states, with at least two reference levels serving as boundaries between the states.

A first bit of each logical state is termed the most significant bit (MSB) and a second bit of each logical state is termed the least significant bit (LSB). Each logical state may be termed a symbol, since it provides information regarding more than one bit. Data may be transmitted and read at both rising and falling edge of a clock cycle, so that each bit signal and each dual-bit signal has a duration of one-half the clock cycle. The logical states are arranged in a Gray coded order, so that an erroneous reading of an adjacent logic state produces an error in only one of the bits. Another characteristic of this logical 4-PAM arrangement is that setting the LSB equal to zero for all states results in a 2-PAM scheme. Alternatively, the logical states can be arranged in numerical (00, 01, 10, 11) or other order.

In one embodiment the communication system is employed for a memory bus that may for instance include random access memory (RAM), like that disclosed in U.S. Pat. No. 5,243,703 to Farmwald et al., which is incorporated herein by reference. The multi-PAM communication and testing techniques disclosed herein may also be used for other contained systems, such as for communication between processors of a multiprocessor apparatus, or between a processor and a peripheral device, such as a disk drive controller or network interface card over an input/output bus.

Figure 2:
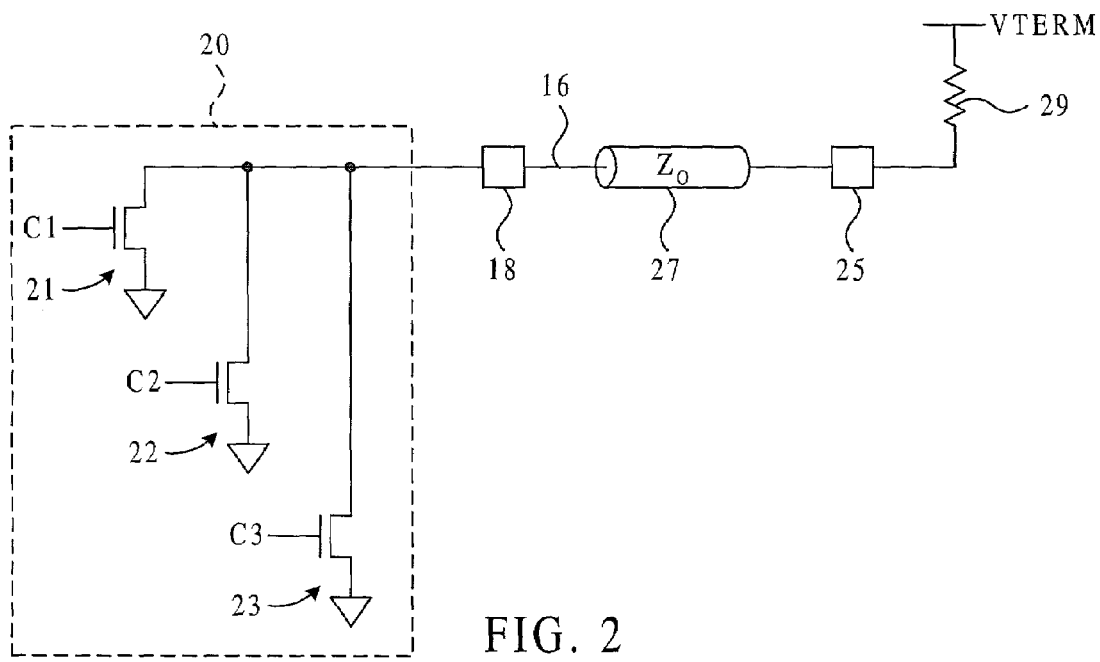
FIG. 2 is a diagram of a representative multilevel signaling device that may be used to create the voltage levels of FIG. 1.

FIG. 2 shows a representation of a communication system that may be used to create the voltage levels of FIG. 1. An output driver 20 drives signals to output pad 18 and over transmission line 16, which may for example be a memory bus or other interconnection between devices affixed to a circuit board, to be received at pad 25. Transmission line 16 has a characteristic impedance $Z_0$ 27 that is substantially matched with a terminating resistor 29 to minimize reflections.

Output driver 20 includes first 21, second 22 and third 23 transistor current sources, which together produce a current I when all are active, pulling the voltage at pad 25 down from VTERM by $I \cdot Z_0$, signaling logical state 10 under the Gray code system. Control signal input through lines C1, C2 and C3 switch respective current sources 21, 22 and 23 on and off. To produce voltage VOUT0=VTERM, signaling logical state 00, current sources 21, 22 and 23 are all turned off. To produce voltage VOUT1=VTERM$-(\frac{1}{3})I \cdot Z_0$, signaling logical state 01, one of the current sources is turned on, and to produce voltage VOUT2=VTERM$-(\frac{2}{3})I \cdot Z_0$, two of the current sources are turned on. The logical level 00 is chosen to have zero current flow to reduce power consumption for the situation in which much of the data transmitted has a MSB and LSB of zero. The reference levels are set halfway between the signal levels, so that VREFH=VTERM$-(\frac{1}{6})I \cdot Z_0$, VREFM=VTERM$-(\frac{1}{2})I \cdot Z_0$, and VREFL=VTERM$(\frac{5}{6})I \cdot Z_0$.

Figure 3:
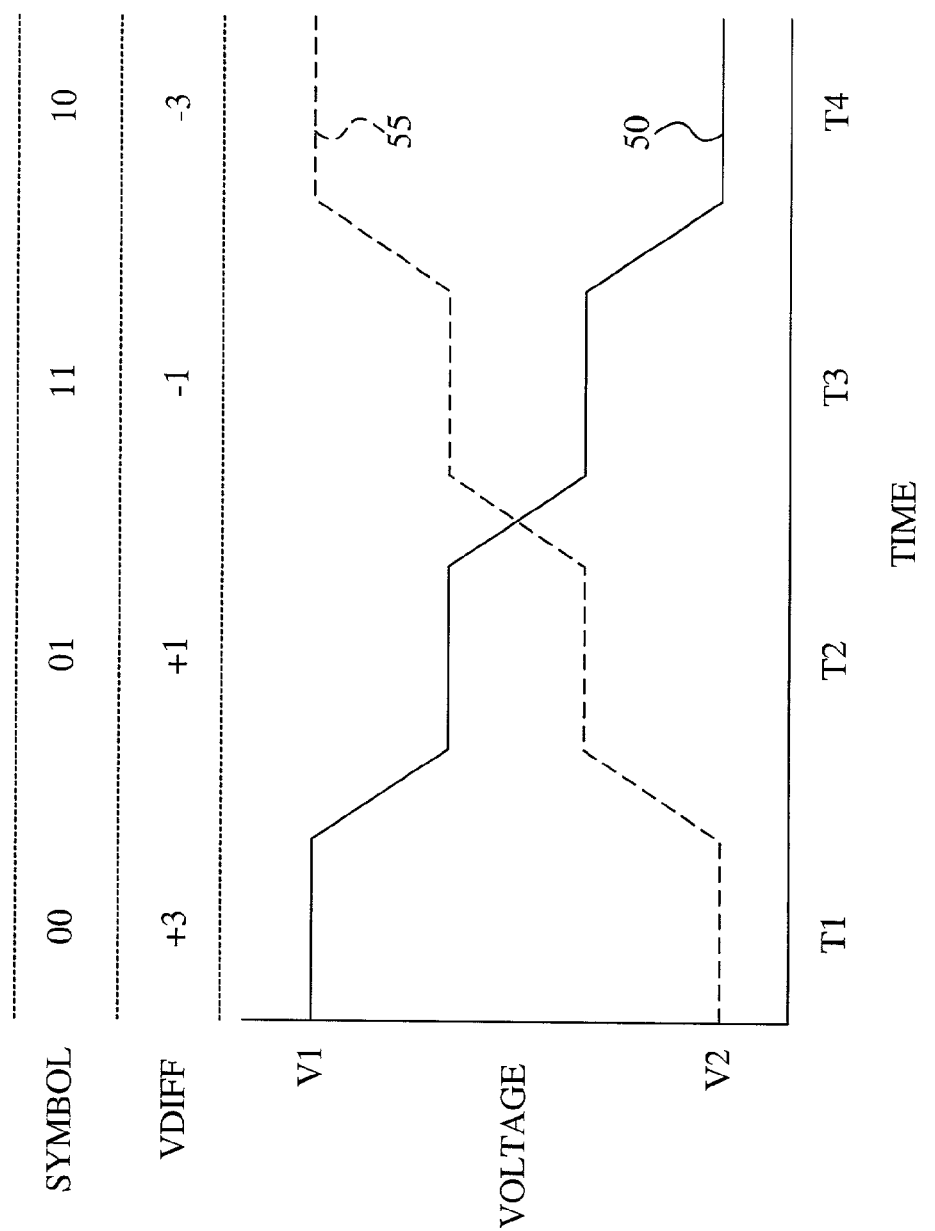
FIG. 3 is a diagram of a differential 4-PAM signaling system.

FIG. 3 shows an example of a differential 4-PAM signaling system where data is encoded on two wires or other transmission media and a symbol value is determined by the voltage difference as measured by a receiver. The use of differential signaling can provide increased immunity to noise and crosstalk. A voltage V1 on one of the wires varies over time between four voltage levels, as shown with solid line 50, while a voltage V2 on the other wire also varies between the four voltage levels but in a complementary fashion, as shown with broken line 55. Voltage differences VDIFF between voltages V1 and V2 for times T1, T2, T3 and T4 are listed above the signals in arbitrary units as +3, +1, −1 and −3, respectively. The MSB and LSB symbols corresponding to the voltage differences are listed above the signals in Gray coded sequence.

Another example of a multilevel signaling apparatus and method is disclosed in U.S. Pat. No. 6,005,895 to Perino et al., which is also incorporated herein by reference. This and other types of multilevel signal interfaces may also be tested in accordance with the present invention. Also incorporated by reference herein is a U.S. Patent application that discloses other means for testing multilevel signal interfaces, entitled "Built-In Self-Testing of Multilevel Signal Interfaces," filed on the same date as the present application and by inventors Werner, Zerbe and Stonecypher of the present application.

Figure 4A:
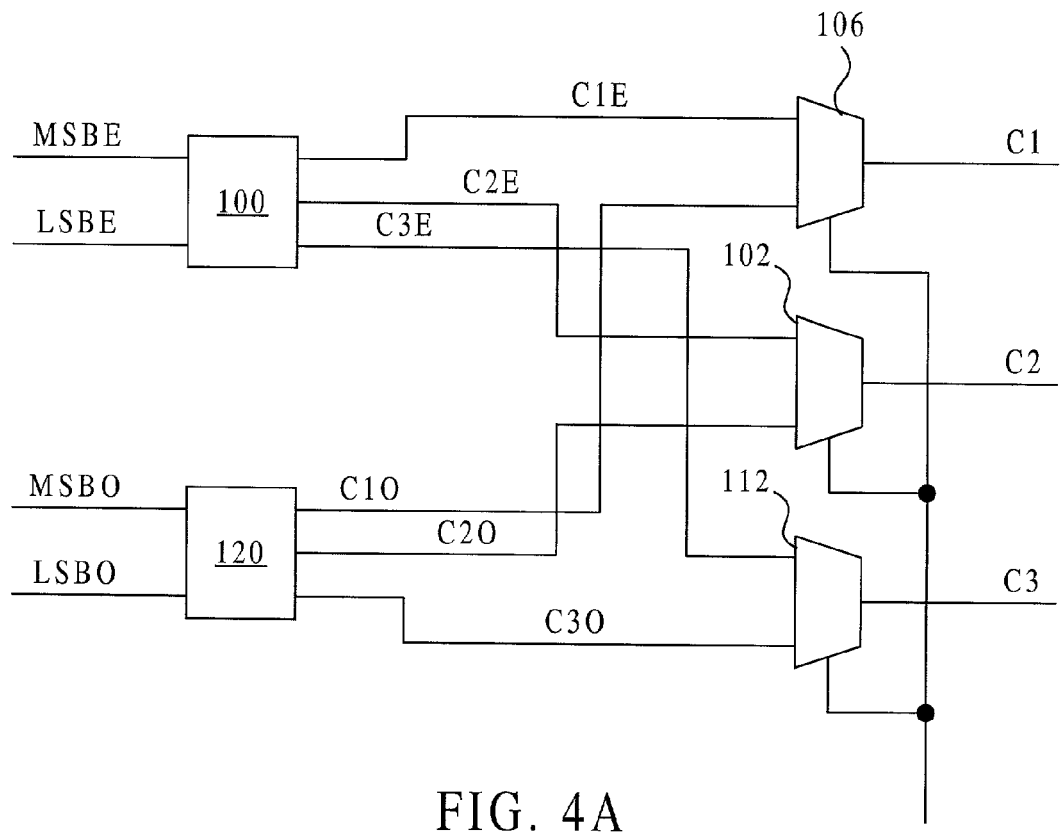
FIG. 4A is a diagram of a pair of encoders translating binary signals into multiplexed control signals for the multilevel signaling device of FIG. 2.

FIG. 4A shows an embodiment for which data is transmitted and read at both rising and falling clock edges, using a pair of substantially identical encoders 100 and 120 translating MSB and LSB odd and even signals into the control signals on lines C1, C2 and C3 for output driver 20. MSB even and LSB even signals on lines MSBE and LSBE are input to encoder 100, which outputs thermometer code signals on lines C1E, C2E and C3E. Similarly, and MSB odd and LSB odd signals on lines MSBO and LSBO are input to encoder 120, which outputs thermometer code signals on lines C1O, C2O and C3O. Lines C1E and C1O input to multiplexer 106, lines C2E and C2O input to multiplexer 102, and lines C3E and C3O input to multiplexer 112. Multiplexers 102, 106 and 112 select the odd or even signals according to a clock select signal on select line 118, outputting the thermometer code control signals on lines C1, C2 and C3.

Figure 4B:
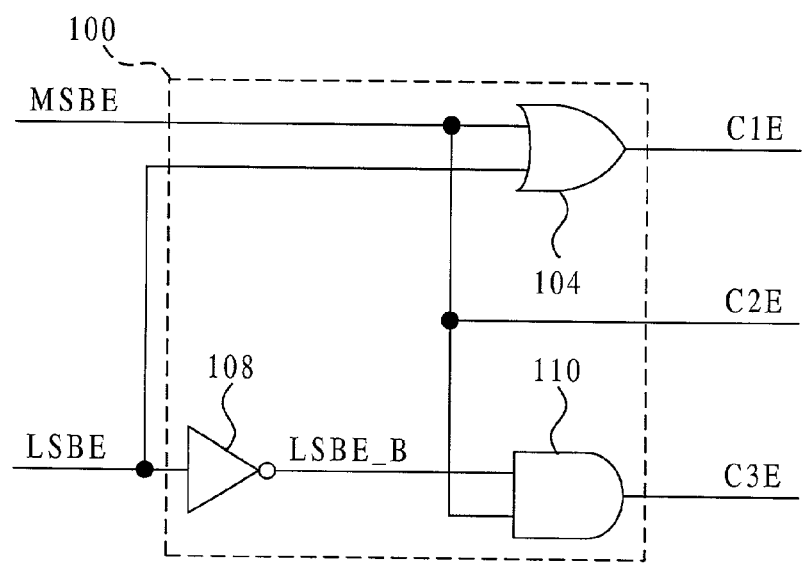
FIG. 4B is a diagram of one of the encoders of FIG. 4A that encodes MSB even and LSB even signals into control signals.

Encoder 100 is shown in more detail in FIG. 4B. MSBE is connected to line C2E. MSBE is also input to an OR gate 104 that has LSBE as its other input, with the output of OR gate 104 connected to line C1E. Signals on line LSBE pass through inverter 108, with the inverted signals on line LSBE_B input to AND gate 110. AND gate 110 receives as its other input line MSBE, with its output connected to line C3E providing a third control signal.

Table 1 illustrates the correspondence between MSB and LSB signals and the control signals on lines C1, C2 and C3 that translate binary signals into 4-PAM signals.

TABLE 1

| MSB | LSB | C1 | C2 | C3 |
|-----|-----|----|----|----|
| 0 | 0 | 0 | 0 | 0 |
| 0 | 1 | 1 | 0 | 0 |
| 1 | 1 | 1 | 1 | 0 |
| 1 | 0 | 1 | 1 | 1 |

For example, when MSB=0 and LSB=0, all the control signals are off. When MSB=0 and LSB=1, the OR gate 104 outputs on, so that the control signal on line C1 is on, but control signals on lines C2 and C3 are still off. When both MSB=1 and LSB=1, control signals on lines C1 and C2 are on, but due to inverted LSB signals input to AND gates such as AND gate 110, the control signal on line C3 is off. When MSB=1 and LSB=0, control signals on all the lines C1, C2 and C3 are turned on. In this fashion the MSB and LSB may be combined as Gray code and translated to thermometer code control signals on lines C1, C2 and C3 that control the current sources to drive 4-PAM signals.

Figure 5A:
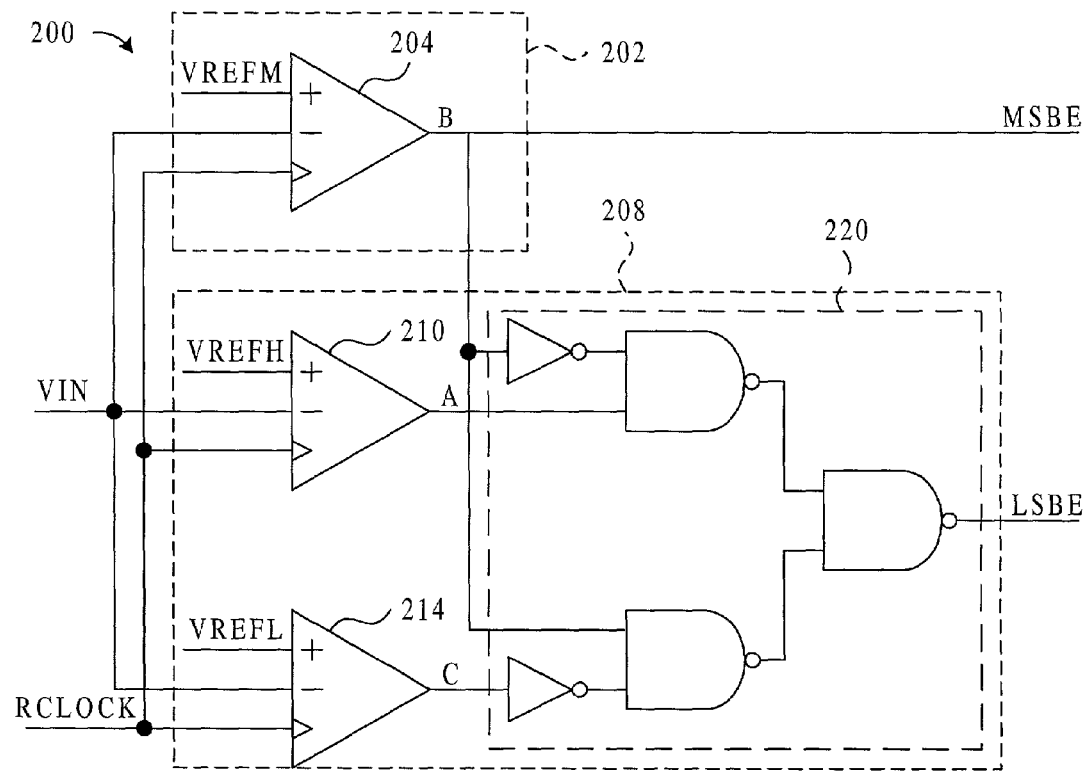
FIG. 5A is a diagram of a receiver and decoder that receives the multilevel signals sent by the signaling device of FIG. 2 and decodes the signals into binary MSB even and LSB even components.
Figure 5B:
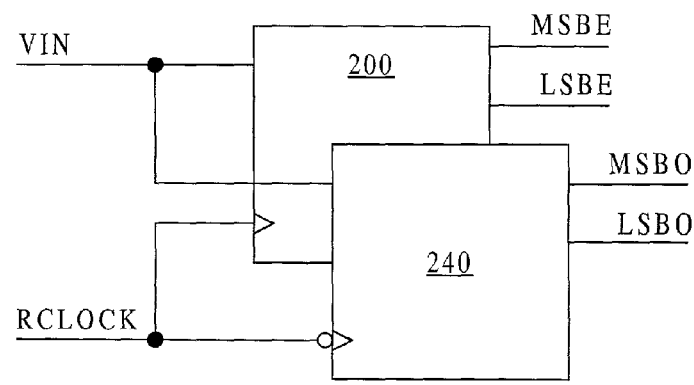
FIG. 5B is a diagram of the receiver and decoder of FIG. 5A along with another receiver and decoder that receive the multilevel signals sent by the signaling device of FIG. 2 and decode the signals into binary MSB and LSB even and odd components.

FIG. 5A shows one possible embodiment of a receiver 200 that may be used to receive the multilevel signals sent by drivers such as those described above, and decode the signals into MSBE and LSBE components. As mentioned above, the data may be transmitted at twice the clock frequency, and a substantially identical receiver 240 is shown in FIG. 5B, with receivers 200 and 240 reading even and odd data, respectively.

An MSBE receiver 202 of the 4-PAM receiver 200 in this example receives and decodes a 4-PAM input signal VIN by determining whether the signal VIN is greater or less than VREFM. In the MSBE receiver 202, a latching comparator 204 compares the value of the voltage of the received input signal VIN to the reference voltage VREFM and latches the value of the result of the comparison B in response to a receive clock signal RCLOCK. Although this embodiment discloses data sampling at both rising and falling clock edges, data may alternatively be sampled at only the rising clock edges or only the falling clock edges.

In an LSBE receiver 208, two latching comparators 210 and 214 compare the value of the voltage of the received input signal VIN to the reference voltages VREFH and VREFL, and latch the value of the result of the comparison A and C, respectively, in response to the receive clock signal. To decode the LSBE, the signals from the comparator outputs B, A, and C are then passed through combinational logic 220. The latching comparators 204, 210 and 214 may be implemented as integrating receivers to reduce the sensitivity of the output signals to noise. This can be accomplished by integrating the difference between the received signal, Vin, and the three respective reference voltages over most or all of the bit cycle, and then latching the integrated results as the outputs A, B and C. Related disclosure of a multi-PAM signaling system can be found in U.S. patent application Ser. No. 09/478,916, entitled "Low Latency Multi-Level Communication Interface," filed on Jan. 6, 2000, which is incorporated by reference herein.

Figure 6:
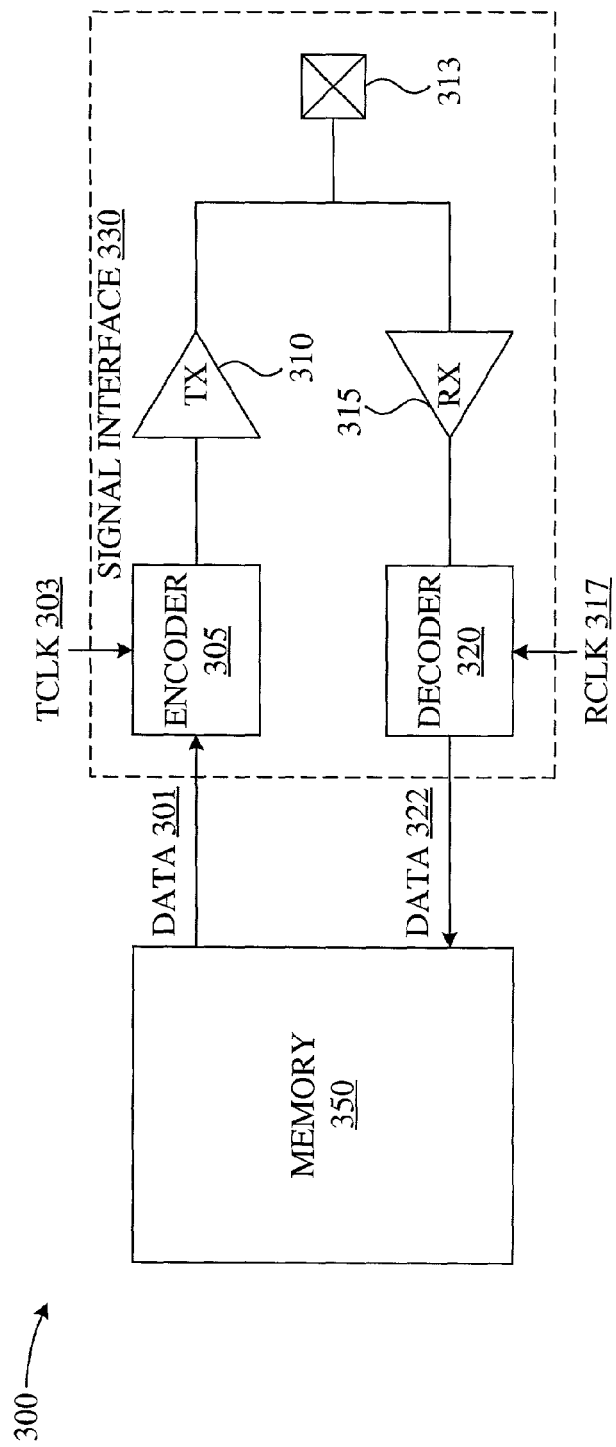
FIG. 6 is a functional block diagram of a device including a multilevel signal interface coupled to a memory.

FIG. 6 shows a functional block diagram of one type of device 300 including a multilevel signal interface 330 coupled to a memory 350, both of which may be tested in accordance with the present invention. Memory 350 may store binary or other forms of data using semiconductor, magnetic, optical, ferroelectric or other known means for storage. Data signals 301 from memory 350 are clocked with transmit clock signals 303 and encoded at encoder 305, which provides control signals to output driver 310. Multilevel signals are transmitted by output driver 310 to input/output pin 313. Encoder 305 and output driver 310 may be similar to encoder 100 and output driver 20 described previously, and input/output pin 313 may represent pads 18 or 25 described above, for example. Also coupled to input/output pin 313 is receiver 315, which is adapted to receive multilevel signals from pin 313. The output of receiver 315 is clocked with receive clock signals 317 and decoded into binary signals at decoder 320 to be output as data 322. Receiver 315 and decoder 320 may be similar to receiver 200 described previously.

Figure 7:
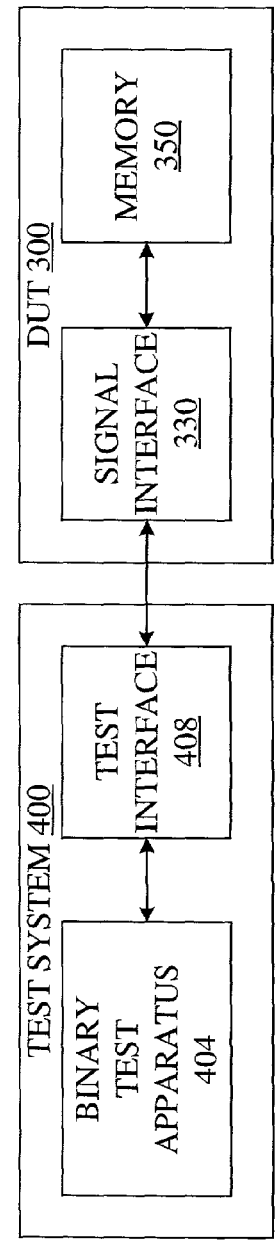
FIG. 7 is a functional block diagram of a system for testing the device of FIG. 6 with a binary test apparatus and a test interface.

FIG. 7 illustrates a system 400 for testing the device 300, which may be termed a device under test (DUT), with a binary test apparatus 404 and a test interface 408. Test apparatus 404 may be conventional, such as model number 83000 or 95000 High Speed Memory tester, available from Agilent Technologies, Palo Alto, Calif., and designed for testing devices employing binary signals. Test interface 408 may be a printed circuit board adapted to provide electrical and mechanical connections between test apparatus 404 and DUT 300, and may be termed a load board. Examples such load boards are described in U.S. Pat. No. 5,686,833 to Spinner, which is incorporated herein by reference.

As mentioned above, DUT 300 contains a multilevel signal interface 330 and memory 350. Device 300 may include many additional transmitters and receivers for communicating binary or multilevel signals via associated input/output pins although, to promote clarity, those additional elements are not shown in this diagram. Communication of binary signals with a multilevel signal interface can be accomplished by use of appropriate control signals, for example by setting LSB equal to zero for all states input to the encoder 100 and output driver 20 described previously. Alternatively, at least one transceiver or transmitter/receiver pair may be devoted exclusively to binary communication.

In either case, the DUT 300 may be tested for errors in binary signals as well as tested for errors in multilevel signals. This testing of binary and multilevel signals can be done during the same or different insertions of DUT 300 into load board 408. For the case in which the binary and multilevel signals are tested during the same insertion of DUT 300 into load board 408, the binary testing can be performed at one time, and the multilevel testing performed at another time.

Either binary or multilevel signals may be characterized by an "eye" diagram. The eye diagram represents the ranges of transmissions voltages and signal transmission times for which data transmission is successful. The width of each eye represents the range of signal transition times, compared to an ideal center time, which still results in successful data transmission. The height of each eye represents the amount of voltage error and noise that a DUT can tolerate, as compared with an ideal central voltage level.

Testing determines the range of transmission voltages and signal transition times for which the DUT can successfully receive data and compares this region to some voltage and timing criteria appropriate for the system. Receiver testing may be done by repeatedly sending data to the DUT using different transmission voltages and signal transmission times and measuring the region for which transmission was successful.

Figure 8:
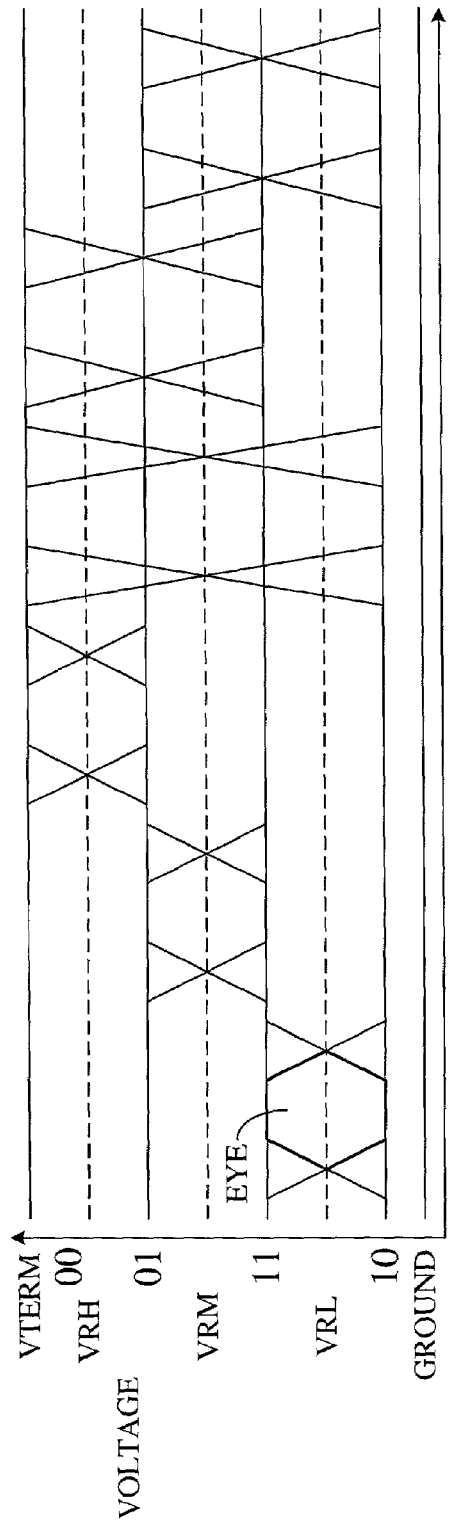
FIG. 8 is a voltage and timing diagram showing that a 4-PAM signal has six possible distinct 2-PAM transitions.

As shown in FIG. 8, a 4-PAM signal has six possible distinct 2-PAM transitions. Each of these transitions will have a characteristic "eye" pattern. Receiver testing may be done by individually measuring the six "eyes" and comparing each of them to voltage and timing criteria.

Figure 9:
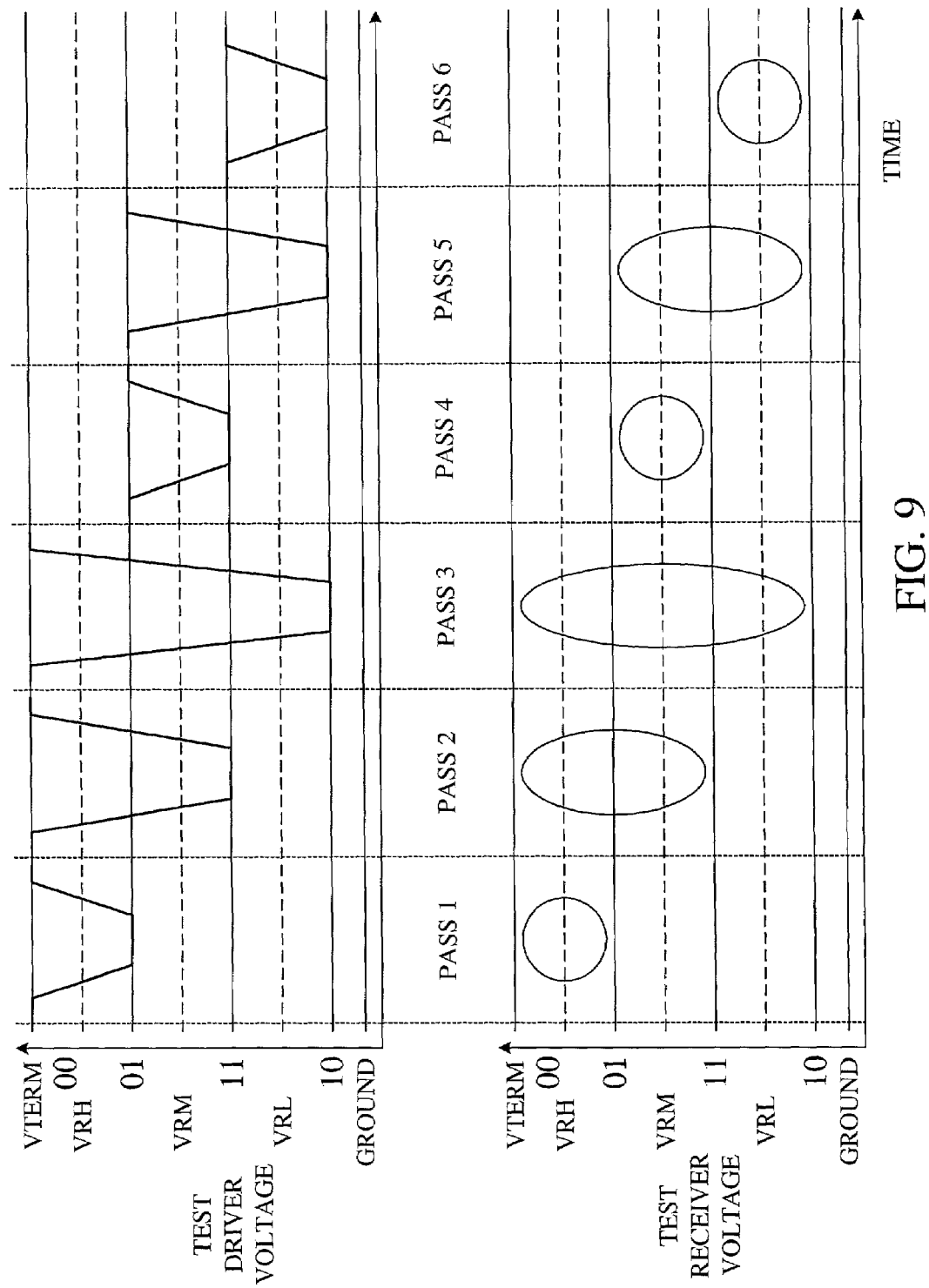
FIG. 9 is a voltage and timing diagram showing six passes that may be used to test a 4-PAM signal interface with a 2-PAM test apparatus.

FIG. 9 shows six passes that may be used to test a 4-PAM signal interface with a 2-PAM test apparatus 404. In an upper portion of FIG. 9, a series of transition signal levels generated by the test apparatus 404 are shown. In a lower portion of FIG. 9 the eye diagrams at the test apparatus 404 for signals received from the DUT 300 are shown. Each of the six 2-PAM sequences can be tested by varying each of the receive reference levels that a signal transition crosses, while holding the others constant. In this case, pass 3 is read three times while a different one of VRH, VRM and VRL is varied during each pass. Pass 2 is read once while VRH is varied and once while VRM is varied. Similarly, pass 5 is read once while VRM is varied and once while VRL is varied. Passes 1, 4, and 6 need only be tested by varying one of the three references. In total, six 2-PAM sequences are tested a total of ten times. Table 2 lists MSB and LSB values for the passes, as well as the reference levels that are checked, with those that are not checked being marked with an X.

TABLE 2

| Pass 1 MSB = 0 | Pass 2 MSB = LSB | Pass 3 LSB = 0 | Pass 4 LSB = 1 | Pass 5 LSB = MSB | Pass 6 MSB = 1 |
|---|---|---|---|---|---|
| VRH | VRH | VRH | X | X | X |
| X | VRM | VRM | VRM | VRM | X |
| X | X | VRL | X | VRL | VRL |

Figure 10:
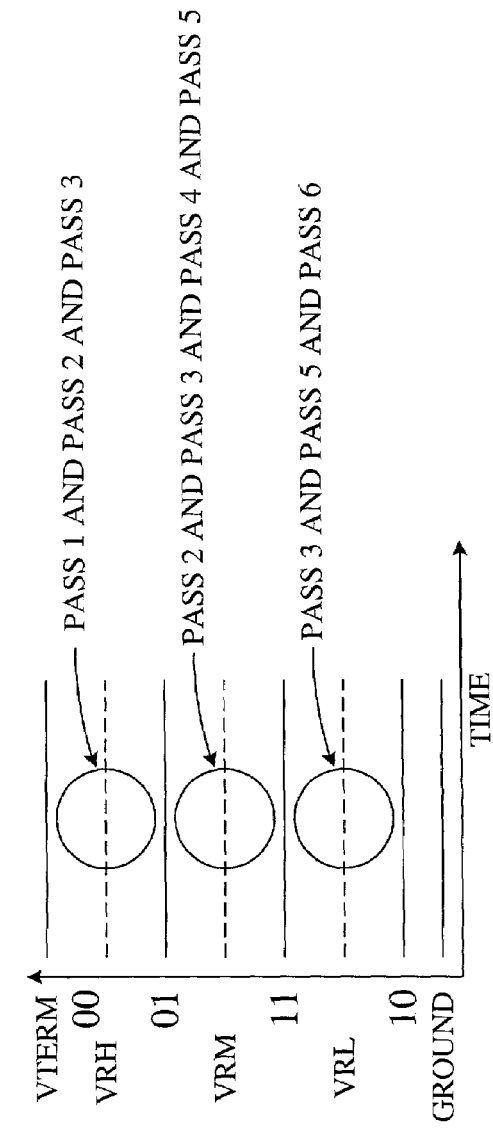
FIG. 10 is a voltage and timing diagram showing the result of selectively superimposing eye patterns from the six passes of FIG. 9 to test for 4-PAM signals with 2-PAM eye patterns.

As shown in FIG. 10, after determining the eyes for each transition, the corresponding eye patterns from the various passes may be superimposed (e.g., logically ANDed together) to generate overall DUT performance characteristics. Alternatively, a sequence of test signals generated by test apparatus 404 may be stored in the memory 350 of the DUT 300 and then transmitted repeatedly from the DUT to the test apparatus, which is programmed to detect different levels of binary signals each time the sequence is received.

Figure 11:
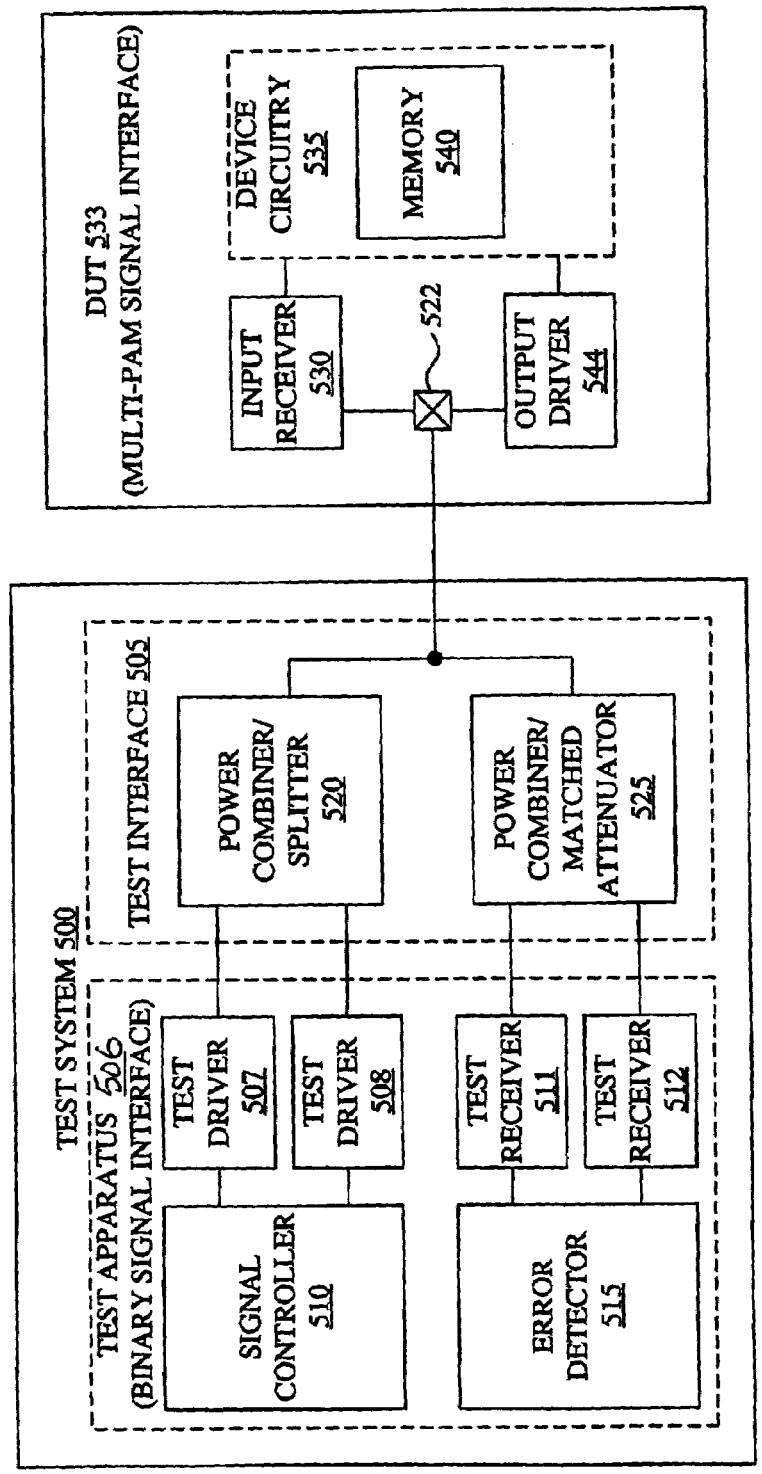
FIG. 11 is a block diagram of a binary test system with a test interface configured for testing a device under test (DUT) having a multilevel signal interface.

FIG. 11 is a block diagram of another test system 500 for testing DUT 300. The test system 500 includes a conventional test apparatus 505 designed for testing devices employing binary signals, such as described above. The test apparatus 505 may have one or more test drivers 507 and 508 that output binary signals based upon inputs from a signal controller 510. Similarly, test apparatus 505 may have one or more test receivers 511 and 512 that categorize signals received from a DUT as binary signals. The binary signals are output from test receivers 511 and/or 512 to an error detector mechanism 515, which compares the signals with those expected in accordance with signal controller 510, and generates an error signal when the signals from receivers differ from those expected. For example, signal controller 510 may be a program executed by the test apparatus 505, including a sequence of digital signals designed to test for errors in DUT 300. A comparison mechanism of error detector 515, such as a plurality of comparitors or a plurality of XOR or XNOR gates, can then determine whether the binary sequence received by test receivers 511 and 512 matches the binary sequence earlier output by test drivers 507 and 508. Alternatively, error detector 515 may be a part of a test program executing on apparatus 505.

In one embodiment the signal controller 510 can produce a pseudo random bit sequence (PRBS), optionally via software, for testing with a detector in DUT 300 coupled to a linear feedback shift register (LFSR) on the DUT 300. Conversely, DUT 300 may produce a PRBS signal and the test receivers 511 and 512 check the received sequence against a program provided to error detector 515. In this manner the input receiver 530 and output driver can be independently tested without using memory 540.

In a conventional implementation, in contrast to that shown in FIG. 11, a first test driver would output a first binary signal to a first pin of a DUT, while a second test driver would output a second binary signal to a second pin of a DUT. In the embodiment shown in FIG. 11, however, test system 500 includes a test interface 506 that includes a matched impedance summer 520, also known as power combiner or power splitter, that sums the signals from test drivers 507 and 508 to produce a multilevel signal that is output to I/O pin 522 of DUT 533. MSB and LSB control signals are input to test drivers 507 and 508 which output binary signals that are summed at power combiner/splitter 520 to form 4-PAM signals that are sent to DUT 533. The MSB test driver 507 outputs twice the voltage of the LSB test driver 508 to correctly weight the 4-PAM signal in this embodiment.

A multilevel input receiver 530 of DUT 533 decodes the multilevel signal and outputs a sequence of binary signals to memory 540. DUT 533 thus can store the multilevel signal received from test system 500, and then output that multilevel signal repeatedly for testing by at least one of the binary test receivers 511 and 512, with the test receivers measuring a different binary threshold when the multilevel signal is repeated. To do this, output driver 544 encodes the sequence of binary signals output by memory 540 and transmits the resulting multilevel signal to test interface 506, which is coupled to test receivers 511 and 512. Test receivers 511 and 512 can be set to different voltage levels, to decode the multilevel signal they received into binary MSB and LSB components that are validated by error detector 515. An optional power combiner 525 is provided on test interface 506 that also serves as a matched attenuator to minimize reflections of the signals output by power combiner 520.

As an example, during a first sequence of signals from memory 540, test receiver 511 can be set to have a binary threshold that matches VREFH of the 4-PAM signal system shown in FIG. 1. During a second sequence of signals from memory 540, test receiver 511 can be set to have a binary threshold that matches VREFM, and during a sequence of signals from memory 540, test receiver 511 can be set to have a binary threshold that matches VREFL. The binary output of test receiver 511 can then be compared by error detector 515 with an expected pattern determined by the sequence of signals input into test drivers 507 and 508.

Table 3 shows the logic levels at various locations in the system of FIG. 11 that correspond to 4-PAM voltage levels ranging between 1.0V and 1.8V, inclusive, the 4-PAM voltage levels listed in the left column of the table.

TABLE 3

| 4-PAM $V_0$ | CONTROL SIGNALS | | TEST DRIVER INPUTS | | TEST RECEIVER EXPECTED DATA | | |
|---|---|---|---|---|---|---|---|
| (V) | MSB | LSB | 507 | 508 | VREFH | VREFM | VREFL |
| 1.800 | 0 | 0 | 1 | 1 | 1 | 1 | 1 |
| 1.533 | 0 | 1 | 1 | 0 | 0 | 1 | 1 |
| 1.266 | 1 | 1 | 0 | 1 | 0 | 0 | 1 |
| 1.00 | 1 | 0 | 0 | 0 | 0 | 0 | 0 |

Gray coded MSB and LSB logic levels of DUT 533 corresponding to the four voltage levels 1.0V, 1.266V, 1.533V and 1.8V, are shown in a second column. Control signals shown in a third column are input into test drivers 507 and 508 to create the four voltages, with the MSB voltage output from driver 507 weighted twice that of the LSB voltage output from driver 508, as described above. Digital test receiver inputs for the 4-PAM signals need to differentiate between three reference levels VREFH, VREFM and VREFL, as described above, and the binary logic corresponding to those level is shown in a fourth column of TABLE 3. Other coding schemes are possible; for example column 2 may be binary rather than Gray coded. Also, a system where signals swing symmetrically above or below a reference voltage may require different symbol mappings in columns 3 and 4.

Test receivers 511 and 512 can both receive signals from a single pin of the DUT and can be set to different binary thresholds, so that testing of DUT 533 for errors in a sequence of combined signals transmitted by test drivers 507 and 508 can be accomplished in only two transmissions of that sequence from DUT to test receivers. For example, in a first transmission of the sequence from DUT 533 to test apparatus 505, receiver 511 can be set to VREFH and receiver 512 can be set to VREFM. During a second transmission of the sequence from DUT 533 to test apparatus 505, receiver 511 can be set to VREFM and receiver 512 can be set to VREFL. Connection of a third test receiver to the DUT pin, in addition to test receivers 511 and 512, allows testing to proceed without repeatedly transmitting the sequence from memory. Certain test apparatuses (e.g., Agilent Technologies 95000 High Speed Memory tester) have receivers that can each look at two voltage levels, V0H and V0L, so that one of those receivers can analyze a sequence of 4-PAM signals input to DUT 533 from test system 500 by transmitting that sequence from output driver 544 twice. Alternatively, two such dual-voltage digital receivers connected to a DUT pin can analyze 4-PAM signals without repeating those signals.

Figure 12:
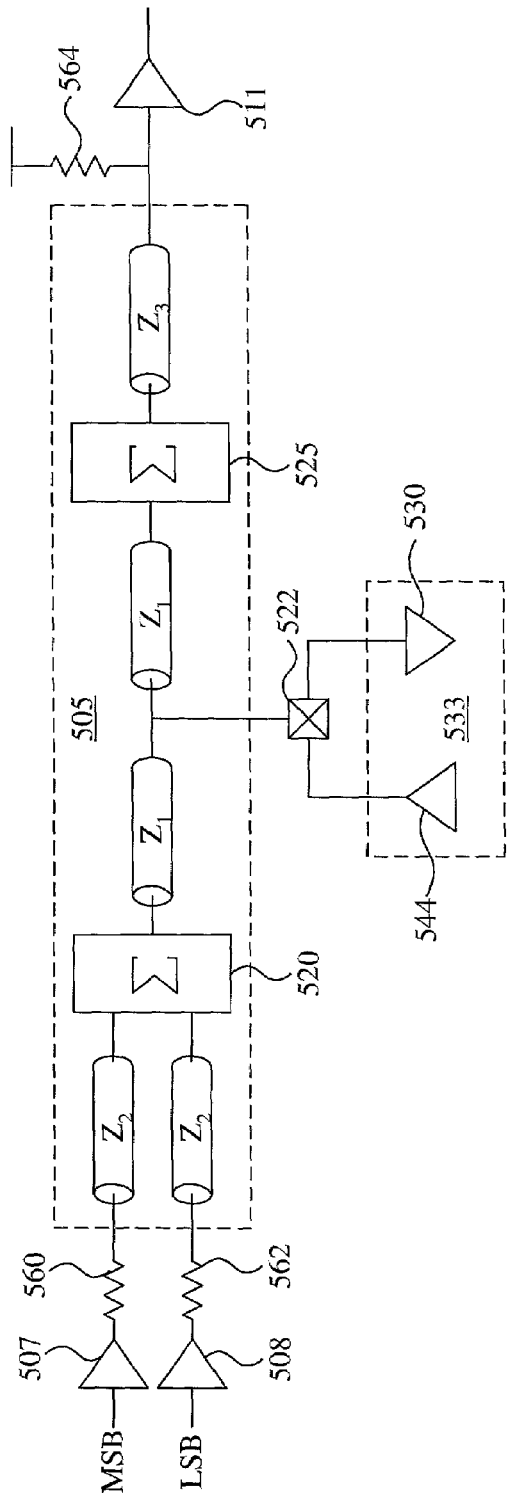
FIG. 12 is a schematic diagram of part of the system of FIG. 11 showing impedance matching for reduced signal reflections.

FIG. 12 shows a schematic diagram of part of the system shown in FIG. 11, including a configuration that reduces reflections during testing by impedance matching for test interface 506, DUT 533 and signal transmission lines. The impedance Z1 of a portion of the test interface 506 connecting power combiner/splitter 520 with DUT 533 is substantially matched with the impedance Z1 of DUT 533. Similarly matched is the impedance Z1 of a portion of the test interface 506 connecting receiver 511 with DUT 533. Source resistors 560 and 562 are provided to match the impedance Z2 of lines connecting test drivers 507 and 508 to power combiner/splitter 520. Receiver 511 provides termination for the signals from the power combiner/splitter 520 for the signals that fly by the DUT 533, with terminating resistor 564 matching the impedance Z3 of the line connecting receiver 511 and power splitter/attenuator 525. Both MSB test driver 507 and LSB test driver 508 outputs are quadrupled relative to the desired voltage levels at DUT 533, to compensate for the voltage drop of power combiner/splitter 520 and the further drop due to the source impedance of the test interface 506. Table 4 shows the voltage levels at drivers 507 and 508 that provide the signal levels of Table 3 at the DUT pin.

TABLE 4

| | Vhigh | Vlow |
|---|---|---|
| MSB Driver | Vterm = 1.8 V | Vterm - 8/3 * Vswing = -0.333 V |
| LSB Driver | Vterm = 1.8 V | Vterm - 4/3 * Vswing = 0.733 V |

In an alternative embodiment, a differential 4-PAM signal such as shown in FIG. 3 may be provided by deploying two of the circuits of FIG. 11 and then driving the MSB drivers and LSB drivers in a complementary manner.

Figure 13:
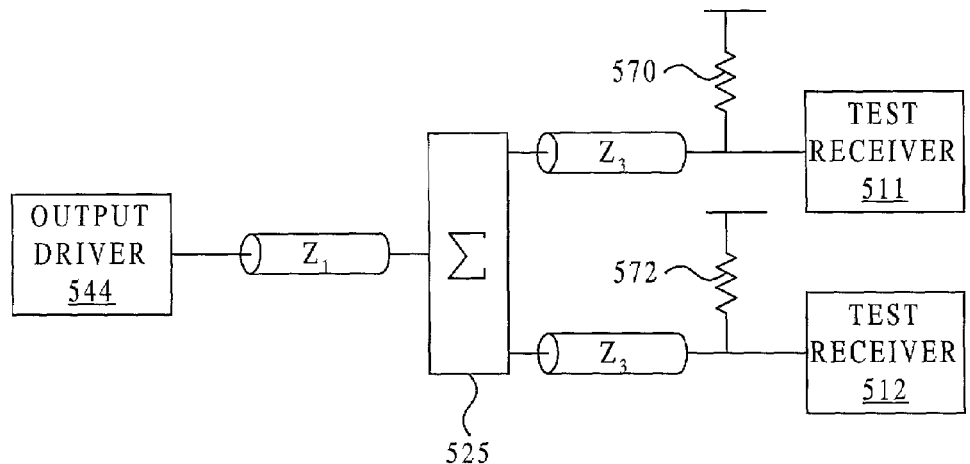
FIG. 13 is a schematic diagram of part of the system of FIG. 11 showing impedance matching of test receivers for reduced signal reflections.

FIG. 13 shows an embodiment in which the test receivers 511 and 512 both receive the multilevel signals output by output driver 544 after distribution by power splitter 525. Resistors 570 and 572 are substantially matched to impedance $Z_2$ of lines connecting test receivers 511 and 512 to power combiner/attenuator 525.

Figure 14:
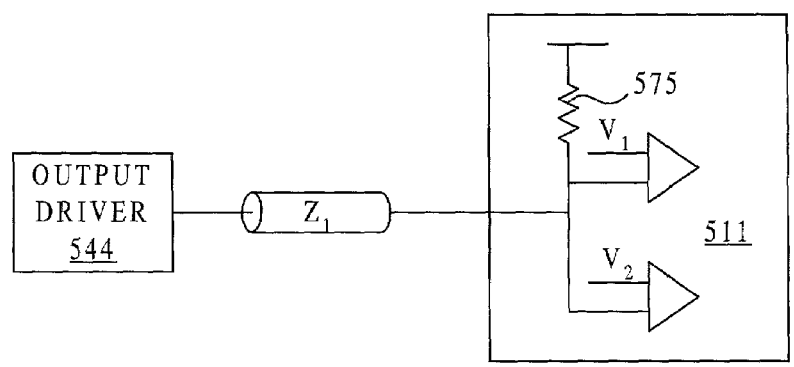
FIG. 14 is a schematic diagram of a receiver of FIG. 11, FIG. 12 or FIG. 13 that can detect dual voltage levels.

FIG. 14 shows an embodiment in which receiver 511 can detect plural voltage levels, $V_1$ and $V_2$. Receiver 512, which is not shown in this figure, may also be able to detect plural voltage levels. Resistor 575 is provided to match the impedance $Z_1$ of lines connecting test receiver 511 and output driver 544, in the absence of power combiner/attenuator 525. For the situation in which the receiver 511 of FIG. 14 is used in the embodiment of FIG. 13, a 4-PAM signal transmitted by output driver 544 may be detected by receivers 511 and 512 without transmitting the signal repeatedly.

Figure 15B:
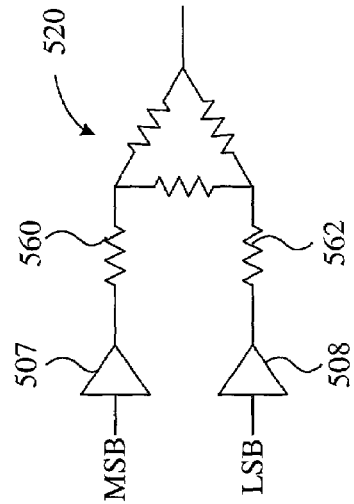
FIG. 15B is a schematic diagram of a second embodiment of a power splitter that can be used in the test interface of FIG. 11 and FIG. 12 to convert binary test signals into 4-PAM test signals.
Figure 15A:
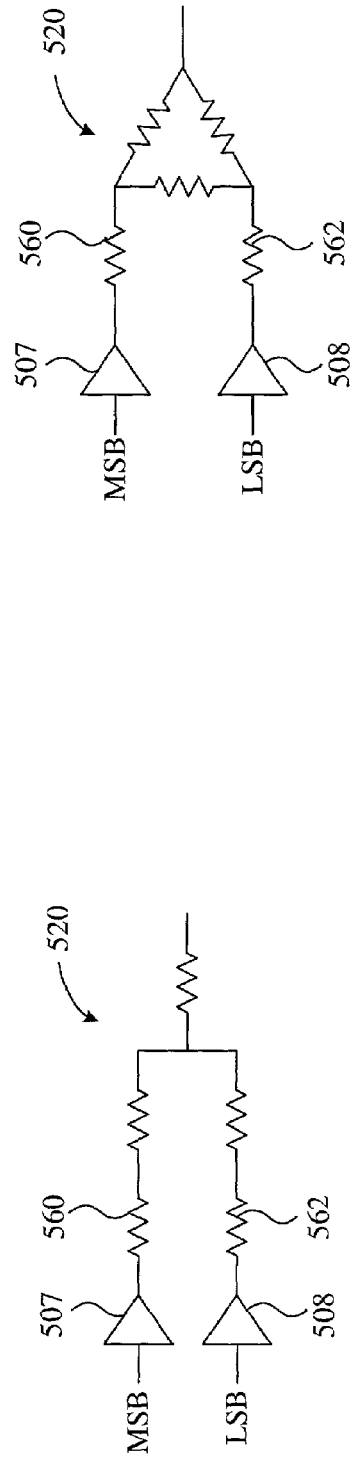
FIG. 15A is a schematic diagram of a first embodiment of a power splitter that can be used in the test interface of FIG. 11 and FIG. 12 to convert binary test signals into 4-PAM test signals.

FIG. 15A shows a first example of a power combiner/splitter 520 that can be used with MSB test driver 507 and LSB test driver 508 to output a 4-PAM signal. FIG. 15B shows a second example of a power combiner/splitter 520 that can be used with MSB test driver 507 and LSB test driver 508 to output a 4-PAM signal.

Figure 16A:
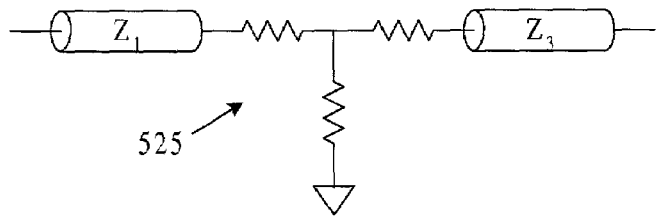
FIG. 16A is a schematic diagram of a first embodiment of a matched attenuator that can be used in the test interface of FIG. 11 and FIG. 12 to reduce signal reflection.
Figure 16B:
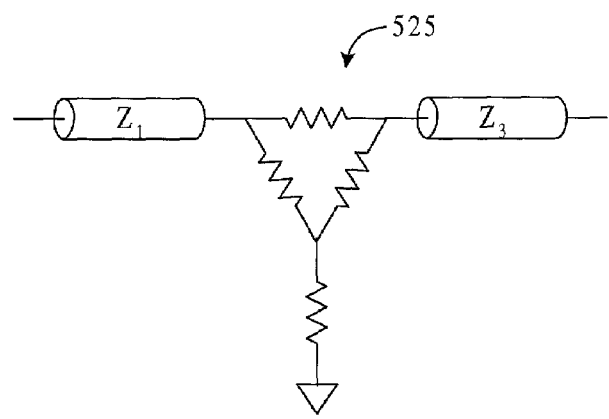
FIG. 16B is a schematic diagram of a second embodiment of a matched attenuator that can be used in the test interface of FIG. 11 and FIG. 12 to reduce signal reflection.
Figure 16C:
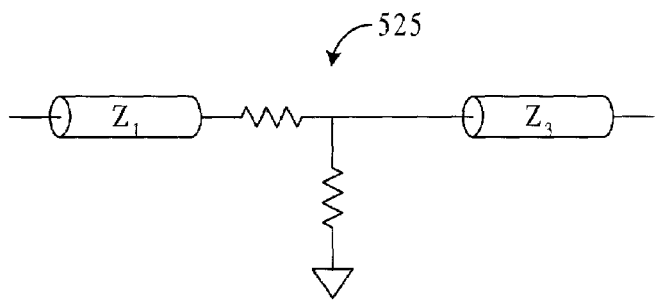
FIG. 16C is a schematic diagram of a third embodiment of a matched attenuator that can be used in the test interface of FIG. 11 and FIG. 12 to reduce signal reflection.

Different matched attenuator embodiments of optional power splitter/attenuator 525 are shown in more detail in FIG. 16A, FIG. 16B and FIG. 16C, the first two of which are symmetric and the third of which is asymmetric. While the signal seen at receiver 511 would be reduced for the matched attenuator embodiment compared to the power splitter embodiment, load board resistors may provide a better termination and therefore reduce reflections when test drivers 507 and 508 write to DUT 533. Reducing reflections is important in a multilevel signaling system because reflected energy decreases voltage margins that have already been reduced by splitting the signal into multiple voltage levels.

Figure 17:
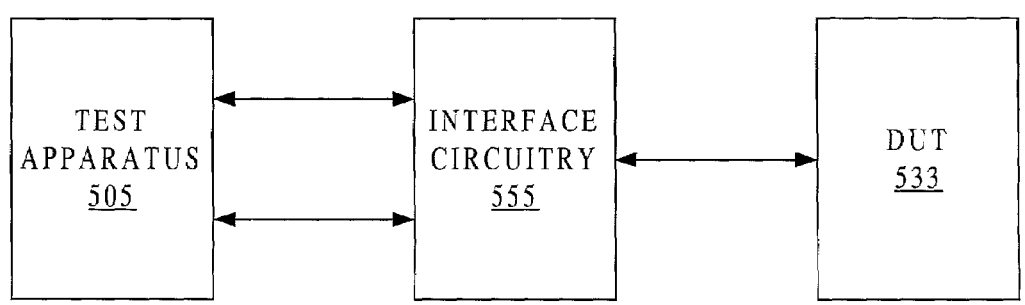
FIG. 17 is a block diagram of a binary test system with a test interface including circuitry configured for testing a DUT having a multilevel signal interface.

In FIG. 17, interface circuitry 555 has been provided to convert multilevel signals from the DUT 533 to binary signals that are input into receivers at test apparatus 505. Interface circuitry 555 can also include circuits for converting binary signals from test apparatus 505 drivers to multilevel signals that are input into a receiver at DUT 533. Interface circuitry 555 may be provided as an integrated circuit (IC) chip and may include circuits similar to those shown in FIG. 4 and FIG. 5 for converting between binary signals of test apparatus 505 and multilevel signals of DUT 533.

Although we have focused on teaching the preferred embodiments of testing, with a binary test apparatus, a device including a multilevel signal interface, other embodiments and modifications of this invention will be apparent to persons of ordinary skill in the art in view of these teachings. Therefore, this invention is limited only by the following claims, which include all such embodiments, modifications and equivalents when viewed in conjunction with the above specification and accompanying drawings.

The invention claim is:

1. A system for testing a device that has a multiple pulse amplitude modulation signal interface, the system comprising:
   a test apparatus including a first test driver configured to transmit binary signals, a first test receiver configured to detect digital signals, and a comparison mechanism configured to determine whether said digital signals match said binary signals, and
   a test interface coupled between the device and said test apparatus to convert said binary signals transmitted by said test apparatus into a first set of multiple pulse amplitude modulation signals at the device, to receive from the device a second set of multiple pulse amplitude modulation signals, said second set of multiple pulse amplitude modulation signals based upon said first set of multiple pulse amplitude modulation signals, and to provide said second set of multiple pulse amplitude modulation signals to said first test receiver, wherein the device is checked for errors.

2. The system of claim 1, wherein:

said test apparatus includes a second test driver to transmit binary signals, and said test interface includes circuitry to input said binary signals from said first and second test drivers and to output said first set of multiple pulse amplitude modulation signals.

3. The system of claim 1, wherein:

the device stores a representation of said first set of multiple pulse amplitude modulation signals, the device transmits to said test interface said second set of multiple pulse amplitude modulation signals at least twice, said test apparatus is configured to detect a first level of digital signals during a first time that said second set of multiple pulse amplitude modulation signals are transmitted, and said test apparatus is configured to detect a second level of digital signals during a second time that said second set of multiple pulse amplitude modulation signals are transmitted.

4. The system of claim 1, wherein:

said first test receiver detects whether said second set of multiple pulse amplitude modulation signals is above or below a reference voltage at a plurality of times, and said reference voltage is set at a first level during a first detection of said second set of multiple pulse amplitude modulation signals by said first test receiver, and said reference voltage is set at a second level during a second detection of said second set of multiple pulse amplitude modulation signals by said first test receiver.

5. The system of claim 1, wherein:

said first test receiver detects whether said second set of multiple pulse amplitude modulation signals is above or below a first reference voltage at a plurality of times, and said first test receiver detects whether said second set of multiple pulse amplitude modulation signals is above or below a second reference voltage at said plurality of times.

6. The system of claim 1, wherein said test interface includes a power combiner that converts said binary signals transmitted by said test apparatus into said first set of multiple pulse amplitude modulation signals at the device.

7. The system of claim 1, wherein:

said test apparatus includes a second test driver that transmits binary signals, and said test interface includes circuitry that combines signals output by said first and second test drivers, such that a voltage output by said first test driver is approximately twice that output by said second test driver.

8. A system for testing a signal interface, the system comprising:

a test apparatus coupled to a device, said device including a receive mechanism that detects a first sequence of multiple pulse amplitude modulation signals, said device including a transmit mechanism coupled to said receive mechanism, said transmit mechanism generating a second sequence of multiple pulse amplitude modulation signals, wherein said second sequence of multiple pulse amplitude modulation signals are based upon said first sequence of multiple pulse amplitude modulation signals, said test apparatus including a first test driver, said test apparatus including a first test receiver, said test apparatus including a comparison mechanism, said first test driver generating a first series of binary signals, said first series of binary signals forming a basis for said first sequence of multiple pulse amplitude modulation signals, said first test receiver receiving said second sequence of multiple pulse amplitude modulation signals, said first test receiver generating a series of digital signals that are based upon said second sequence of multiple pulse amplitude modulation signals, said comparison mechanism comparing said series of binary signals with said series of digital signals.

9. The system of claim 8, wherein:

said receive mechanism has a characteristic impedance, and said receive mechanism and said test apparatus are connected by a test interface having an impedance substantially matching said characteristic impedance.

10. The system of claim 8, wherein:

said test apparatus includes a second test driver outputting a second series of binary signals, said device and said test apparatus are connected by a test interface, and said test interface includes circuitry combining said first and second series of binary signals to create said first sequence of multiple pulse amplitude modulation signals.

11. The system of claim 8, wherein:

said transmit mechanism includes a number of output drivers, said receive mechanism includes said number of signal detectors, and each one of said output drivers is connected to a corresponding one of said signal detectors.

12. The system of claim 8, wherein said transmit mechanism and said receive mechanism are disposed on an integrated circuit chip.

13. The system of claim 8, wherein said first sequence of multiple pulse amplitude modulation signals is substantially identical to said second sequence of multiple pulse amplitude modulation signals.

14. The system of claim 8, wherein:

said first test receiver receiving said second sequence of multiple pulse amplitude modulation signals by detecting whether said second sequence of multiple pulse amplitude modulation signals is above or below a first voltage level during a first plurality of times, said first test receiver detecting a binary signal with a first voltage level during a first time period, and the device is checked for errors by detecting said second sequence of multiple pulse amplitude modulation signals with said first test receiver set at different binary signal levels.

15. A method for testing a signal interface with a test apparatus, the method comprising:

transmitting, by the test apparatus, a sequence of binary signals, receiving, by the signal interface, a sequence of digital signals corresponding to said sequence of binary signals, transmitting, by the signal interface, a sequence of multiple pulse amplitude modulation signals corresponding to said sequence of digital signals, comparing, by the test apparatus, said sequence of multiple pulse amplitude modulation signals with a first reference level, thereby obtaining a first series of results, comparing, by the test apparatus, said sequence of multiple pulse amplitude modulation signals with a second reference level, thereby obtaining a second series of results.

16. The method of claim 15, further comprising combining said first and second series of results.

17. The method of claim 15, wherein said comparing said sequence of multiple pulse amplitude modulation signals with said first reference level and said comparing said sequence of multiple pulse amplitude modulation signals with said second reference level occur simultaneously.

18. The method of claim 15, wherein said comparing said sequence of multiple pulse amplitude modulation signals with said first reference level and said comparing said sequence of multiple pulse amplitude modulation signals with said second reference level occur sequentially.

19. The method of claim 15, wherein said digital signals are substantially identical to said binary signals.

20. The method of claim 15, wherein said multiple pulse amplitude modulation signals are substantially identical to said digital signals.

21. The method of claim 15, further comprising converting, by a test interface coupled between the test apparatus and the multiple pulse amplitude modulation signal interface, said sequence of digital signals into said corresponding sequence of multiple pulse amplitude modulation signals.

22. The method of claim 15, further comprising storing, in a memory associated with the multiple pulse amplitude modulation signal interface, a representation of said sequence of multiple pulse amplitude modulation signals.

23. The method of claim 15, further comprising:
comparing, by the test apparatus, said sequence of multiple pulse amplitude modulation signals with a third reference level, thereby obtaining a third series of results.

24. A method for testing a signal interface with a test apparatus, the method comprising:

transmitting, by the signal interface, a sequence of multiple pulse amplitude modulation signals corresponding to a first sequence of binary signals, comparing, by the test apparatus, said sequence of multiple pulse amplitude modulation signals with a first reference level, thereby obtaining a first series of results, comparing, by the test apparatus, said sequence of multiple pulse amplitude modulation signals with a second reference level, thereby obtaining a second series of results, and combining said first series of results with said second series of results to obtain a second sequence of binary signals.

25. The method of claim 24, further comprising comparing, by the test apparatus, said first sequence of binary signals with said second sequence of binary signals.

26. A method for testing a device with a test apparatus, the method comprising:

transmitting, by the test apparatus, first and second sequences of binary signals, receiving, by a signal interface, said first and second sequences of binary signals, combining, by the signal interface, said first and second sequences of binary signals into a sequence of multiple pulse amplitude modulation signals, and transmitting, from the signal interface to the test device, said sequence of multiple pulse amplitude modulation signals corresponding to said sequence of digital signals.

* * * * *